(12) United States Patent
Minamio et al.

(10) Patent No.: US 9,013,029 B2
(45) Date of Patent: Apr. 21, 2015

(54) JOINED BODY HAVING AN ANTI-CORROSION FILM FORMED AROUND A JUNCTION PORTION, AND A SEMICONDUCTOR DEVICE HAVING THE SAME

(75) Inventors: Masanori Minamio, Osaka (JP); Tatsuo Sasaoka, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 13/882,436

(22) PCT Filed: Aug. 8, 2012

(86) PCT No.: PCT/JP2012/005039
§ 371 (c)(1),
(2), (4) Date: Apr. 29, 2013

(87) PCT Pub. No.: WO2013/027354
PCT Pub. Date: Feb. 28, 2013

(65) Prior Publication Data
US 2013/0221502 A1  Aug. 29, 2013

(30) Foreign Application Priority Data
Aug. 25, 2011 (JP) ................. 2011-183714

(51) Int. Cl.
*H01L 23/495* (2006.01)
*H01L 21/48* (2006.01)
(Continued)

(52) U.S. Cl.
CPC ........ *H01L 21/4842* (2013.01); *H01L 23/4334* (2013.01); *H01L 23/49537* (2013.01);
(Continued)

(58) Field of Classification Search
CPC ............. H01L 21/4842; H01L 2224/45147; H01L 2224/85205; H01L 2924/01029; H01L 2224/13147; H01L 2924/15747; H01L 2224/45647
USPC .......... 257/666, 773, 774; 228/206, 207, 199, 228/111
See application file for complete search history.

(56) References Cited

U.S. PATENT DOCUMENTS 2,868,863 A * 1/1959 Cook .......................... 174/94 R
4,188,438 A   2/1980 Burns
(Continued)

FOREIGN PATENT DOCUMENTS

GB  2097298 A   11/1982
JP  59-052031 B2  12/1984
(Continued)

OTHER PUBLICATIONS

International Search Report issued in International Patent Application No. PCT/JP2012/005039 mailed on Nov. 13, 2012.
(Continued)

*Primary Examiner* — Alexander Oscar Williams
(74) *Attorney, Agent, or Firm* — McDermott Will & Emery LLP (57) ABSTRACT

A joined body which is formed by, first, an aqueous solution containing an oxide film remover is disposed on a junction region of a first metal plate. Then, with the aqueous solution remaining on the first metal plate, a second metal plate is placed on the first metal plate. Thereafter, a load is applied to junction regions of the first metal plate and the second metal plate in the vertical direction, thereby joining the first metal plate and the second metal plate together to form a junction portion.

8 Claims, 8 Drawing Sheets (51) Int. Cl.
- *H01L 23/433* (2006.01)
- *B23K 20/02* (2006.01)
- *B23K 20/16* (2006.01)
- *B23K 20/227* (2006.01)
- *B23K 20/233* (2006.01)
- *B23K 35/00* (2006.01)

(52) U.S. Cl.
CPC ...... *H01L23/49575* (2013.01); *H01L 21/4825* (2013.01); *H01L 21/4835* (2013.01); *H01L 2224/32245* (2013.01); *H01L 2224/48247* (2013.01); *H01L 2224/73265* (2013.01); *H01L 23/495* (2013.01); *H01L 2924/13091* (2013.01); *H01L 2224/48091* (2013.01); *H01L 2924/13055* (2013.01); *B23K 20/023* (2013.01); *B23K 20/16* (2013.01); *B23K 20/227* (2013.01); *B23K 20/233* (2013.01); *B23K 2201/18* (2013.01); *B23K 2201/42* (2013.01); *B23K 2203/04* (2013.01); *B23K 2203/10* (2013.01); *B23K 2203/12* (2013.01); *B23K 35/002* (2013.01); *B23K 35/004* (2013.01); *B23K 35/007* (2013.01); *H01L 2924/1305* (2013.01)

(56) References Cited

U.S. PATENT DOCUMENTS

| | | | | |
|---|---|---|---|---|
| 4,318,966 A * | 3/1982 | Fawcett | | 428/683 |
| 4,622,116 A * | 11/1986 | Elton et al. | | 204/485 |
| 4,751,146 A * | 6/1988 | Maeda et al. | | 428/475.8 |
| 5,695,863 A * | 12/1997 | Bloemen et al. | | 428/212 |
| 5,922,850 A * | 7/1999 | Marciel | | 536/18.6 |
| 6,160,342 A * | 12/2000 | Nishikawa et al. | | 313/141 |
| 6,291,094 B1 * | 9/2001 | Yoshimura et al. | | 429/492 |
| 6,410,365 B1 * | 6/2002 | Kawata et al. | | 438/123 |
| 6,515,218 B1 * | 2/2003 | Shimizu et al. | | 136/256 |
| 6,524,698 B1 * | 2/2003 | Schmoock | | 428/336 |
| 6,649,282 B1 * | 11/2003 | Yamaguchi et al. | | 428/648 |
| 6,884,390 B1 * | 4/2005 | McConville et al. | | 422/1 |
| 7,115,324 B1 | 10/2006 | Stol et al. | | |
| 7,736,730 B2 * | 6/2010 | Jung et al. | | 427/409 |
| 2006/0027633 A1 | 2/2006 | Miyake | | |
| 2006/0134501 A1 * | 6/2006 | Lee et al. | | 429/38 |
| 2008/0251062 A1 * | 10/2008 | Dodo | | 126/263.02 |
| 2008/0283038 A1 * | 11/2008 | Dodo | | 126/263.06 |
| 2009/0053553 A1 * | 2/2009 | Masago et al. | | 428/647 |
| 2009/0068452 A1 | 3/2009 | Sato | | |
| 2009/0183825 A1 | 7/2009 | Sato et al. | | |
| 2011/0118655 A1 * | 5/2011 | Fassih et al. | | 604/20 |
| 2011/0206943 A1 * | 8/2011 | Willis et al. | | 428/609 |
| 2011/0287336 A1 * | 11/2011 | Himeno et al. | | 429/492 |
| 2011/0310498 A1 * | 12/2011 | Cheng | | 359/819 |
| 2012/0258281 A1 | 10/2012 | Shinozaki et al. | | |

FOREIGN PATENT DOCUMENTS

| | | |
|---|---|---|
| JP | 09-232367 A | 9/1997 |
| JP | 2004-146731 A | 5/2004 |
| JP | 2004-273230 A | 9/2004 |
| JP | 2006-334562 A | 12/2006 |
| JP | 2006-334652 A | 12/2006 |
| JP | 2007-090394 A | 4/2007 |
| JP | 2008-229658 A | 10/2008 |
| JP | 2010-089993 A | 4/2010 |
| JP | 2010-277754 A | 12/2010 |
| JP | 2011-210968 A | 10/2011 |

OTHER PUBLICATIONS

Chinese Office Action and Search Report issued in Chinese Application No. 201280003849.3 dated Dec. 22, 2014, with English Translation.

* cited by examiner

JOINED BODY HAVING AN ANTI-CORROSION FILM FORMED AROUND A JUNCTION PORTION, AND A SEMICONDUCTOR DEVICE HAVING THE SAME

RELATED APPLICATIONS

This application is the U.S. National Phase under 35 U.S.C. §371 of International Application No. PCT/JP2012/005039, filed on Aug. 8, 2012, which in turn claims the benefit of Japanese Application No. 2011-183714, filed on Aug. 25, 2011, the disclosures of which Applications are incorporated by reference herein.

TECHNICAL FIELD

The present disclosure relates to techniques of joining junction target members together, and more particularly to a joined body, a power semiconductor device, and manufacturing methods of joined body and the power semiconductor device.

BACKGROUND ART

One of conventional techniques for joining metals of different types or the same type together is cold welding which applies a load to members to be joined (hereinafter referred to as junction target members) to join the junction target members together (see, for example Patent Document 1, Japanese Patent Publication No. S59-052031).

Conventional cold welding will be described hereinafter with reference to FIGS. 8A-8C.

Figure 8A:
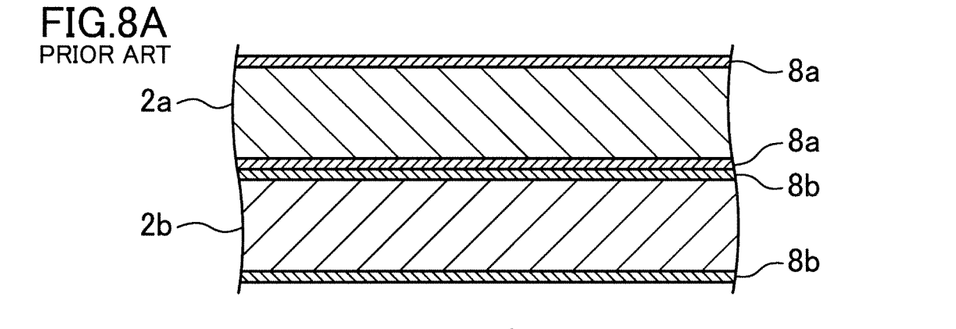
FIGS. 8A-8C are cross-sectional views illustrating conventional cold welding of metals in the order of process steps.

First, as illustrated in FIG. 8A, a plate member 2a whose front and back surfaces are coated with plating layers 8a and a plate member 2b whose front and back surfaces are coated with plating layers 8b are stacked. The plating layers 8a and 8b are made of nickel (Ni), and the plate members 2a and 2b are made of copper (Cu).

Figure 8B:
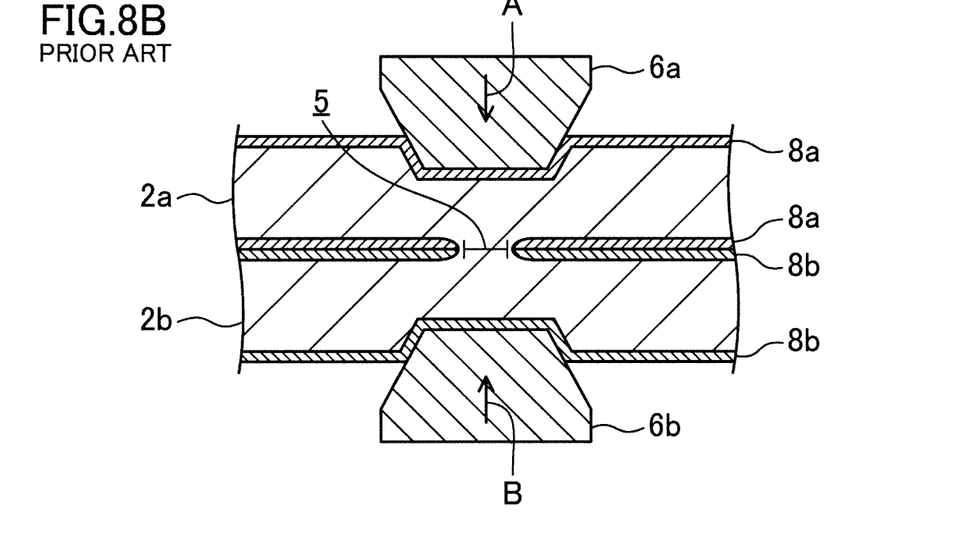
Figure 8C:
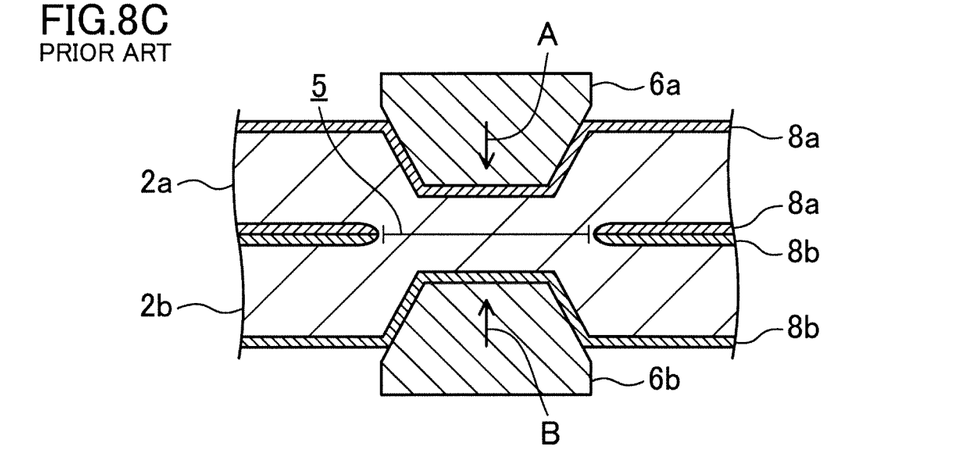

Next, as illustrated in FIGS. 8B and 8C, each contact surface of a dice 6a is brought into contact with the plate member 2a with the plating layer 8a interposed therebetween, and a pressure is applied to the plate member 2a in the direction indicated by the arrow A. Similarly, as illustrated in FIGS. 8B and 8C, each contact surface of a dice 6b is brought into contact with the plate member 2b with the plating layer 8b interposed therebetween, and a pressure is applied to the plate member 2b in the direction indicated by the arrow B. At this time, since copper has ductility higher than nickel, each of the plating layers 8a and 8b that are in pressure contact with each other cannot follow a plastic flow of the plate member 2a or 2b, and reaches a breaking point to be divided. Consequently, a pressure contact portion 5 formed by a bare surface is formed on regions of the plate members 2a and 2b where the plate members 2a and 2b are divided. Here, even if an oxide film is interposed between each of the plating layers 8a and 8b and an associated one of the plate members 2a and 2b, the oxide film follows the division of each of the plating layers 8a and 8b and moves, thereby exposing the bare surface on each of the plate members 2a and 2b.

Thus, the plate members 2a and 2b can be joined together by providing plate members 2a and 2b with the plating layers 8a and 8b having lower ductility than the plate members 2a and 2b without removing oxide films formed on the plate members 2a and 2b to be in pressure contact with each other.

There is also a junction technique of replacing an oxide film removal solution with an oxidation inhibitor (see, for example, Patent Document 2, Japanese Patent Publication No. 2006-334652). In Patent Document 2, in joining metals at least one of which is made of copper, a junction surface of copper is brought into contact with the oxide film removal solution to remove an oxide film on the junction surface. Then, the junction surfaces of metals to be joined are brought into contact with each other with the oxide film removal solution remaining on the junction surface of copper, and are subjected to heat and pressure, thereby joining the metals together with the oxide film removal solution replaced with an oxidation inhibitor.

CITATION LIST

Patent Document

[Patent Document 1] Japanese Patent Publication No. S59-052031

[Patent Document 2] Japanese Patent Publication No. 2006-334652

SUMMARY OF THE INVENTION

Technical Problem

In the cold welding of Patent Document 1, however, plating layers or oxide films might be insufficiently divided. In such a case, the possibility of low electrical stability in a junction portion arises.

The junction technique of Patent Document 2 needs to replace the oxide film removal solution with the oxidation inhibitor, and thus, has the possibility of complicated conditions for the replacement.

It is therefore an object of the present disclosure to perform an electrically stable junction by utilizing a mechanical pressure contact between metals.

Solution to the Problem

To achieve the object, a manufacturing method of a joined body according to the present disclosure includes disposing a solution containing an oxide film remover on a junction region of a first junction target member made of a metal, and then placing a second junction target member made of a metal on the first junction target member; applying a load to the junction region of the first junction target member, thereby joining the first junction target member and the second junction target member together to form a joined body.

To achieve the object, in a joined body according to the present disclosure, an anti-corrosion film is formed around a junction portion formed by a first junction target member and a second junction target member each made of a metal.

Advantages of the Invention

A joined body, a power semiconductor device, and manufacturing methods of the joined body and the power semiconductor device according to the present disclosure enable electrically stable junction by utilizing mechanical pressure contact between metals.

BRIEF DESCRIPTION OF THE DRAWINGS

[FIG. 1]

[FIG. 2]

[FIG. 3]

[FIG. 4]

[FIG. 5]

[FIG. 6]

[FIG. 7]

[FIG. 8]

DESCRIPTION OF EMBODIMENTS (Embodiment)

A joined body and a manufacturing method of the joined body according to an embodiment of the present disclosure will be described with reference to the flowchart of FIG. 1 and FIGS. 2A-2C and FIG. 3. In this embodiment, an oxide film is formed on the surface of each of a first metal plate 101 and a second metal plate 102.

Figure 1:
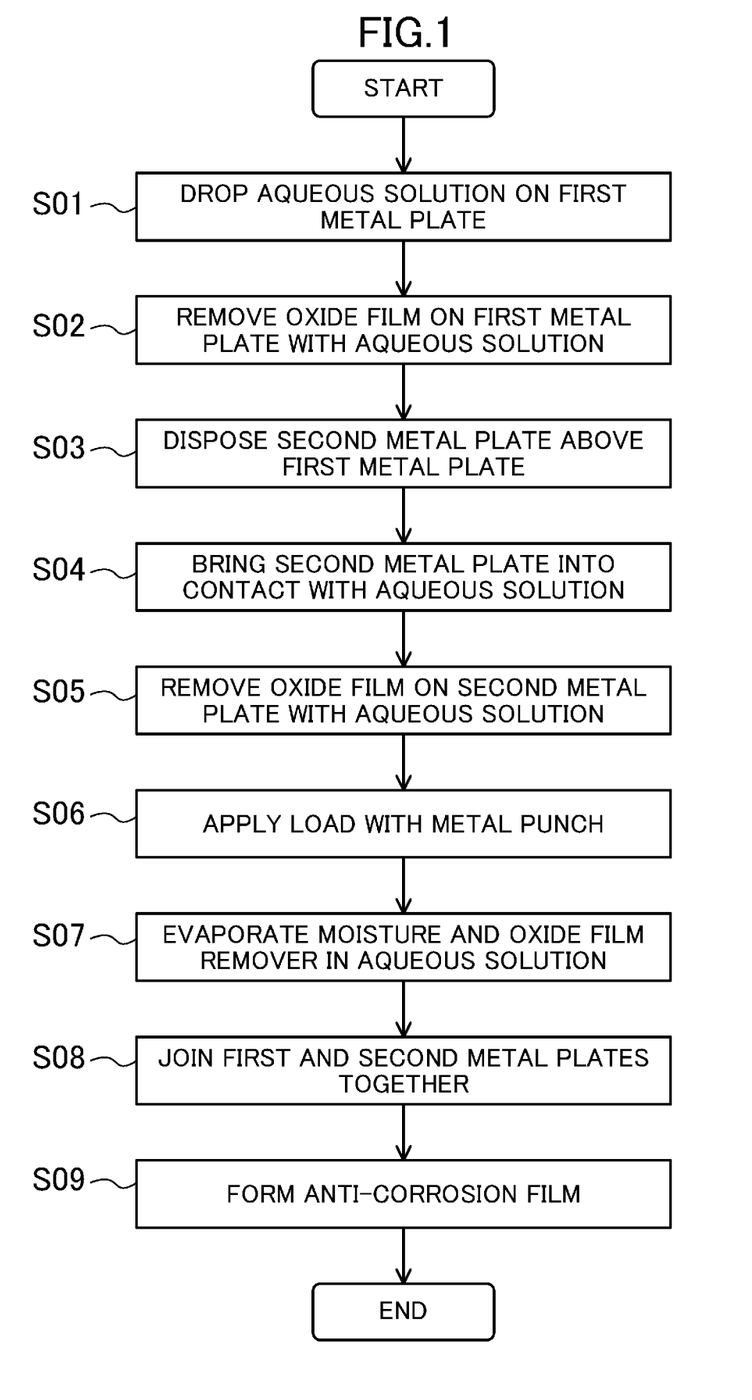
FIG. 1 is a flowchart showing an inter-metal junction technique according to an embodiment of the present disclosure.
Figure 2A:
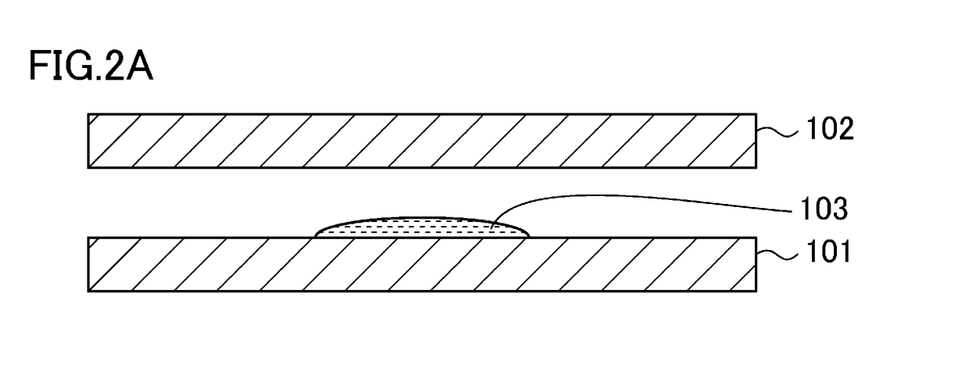
FIGS. 2A-2C are cross-sectional views showing the inter-metal junction technique of the embodiment in the order of process steps.

First, as a first process step, as illustrated in FIG. 2A, an aqueous solution 103 as an example of a solution is dropped on a region where a junction portion is to be formed (hereinafter referred to as a "junction region") of a first metal plate (a first junction target member) 101 as an example of a junction target member (step S01 in FIG. 1). The aqueous solution 103 contains an oxide film remover, an oxidation inhibitor (a rust preventive), and a rheology control (viscosity reducing) agent. The content of the aqueous solution 103 except the above-listed materials is water ($H_2O$). By dropping the aqueous solution 103 onto the first metal plate 101, an oxide film on the first metal plate 101 is removed, thereby exposing a bare surface (step S02 in FIG. 1). Thereafter, a second metal plate 102 to be joined with the first metal plate 101 is disposed and kept above the first metal plate 101 (step S03 in FIG. 1). The junction region is a region defined to form a junction portion 110 between the first metal plate 101 and the second metal plate 102 illustrated in FIG. 2C. The size of the junction region can be obtained based on a junction area between metals previously calculated using, for example, existing experimental data.

In this embodiment, the oxide film remover is potassium hydroxide (KOH) having a concentration (mass %) of 2% or less. The oxidation inhibitor is diethylethanolamine $((HOCH_2CH_2)_2NH)$ having a concentration (mass %) of 2% or less. The rheology control agent is polypropylene glycol (PPG) having a concentration (mass %) of 2% or less.

The oxide film remover may be lithium hydroxide (LiOH), sodium hydroxide (NaOH), formic acid (HCOOH), or acetic acid ($CH_3COOH$), instead of potassium hydroxide. The oxidation inhibitor may be dicyclohexylamine, instead of diethylethanolamine. The rheology control agent may be polyethylene glycol (PEG) instead of polypropylene glycol.

In this embodiment, to achieve only electrical stability during junction, the aqueous solution 103 only needs to contain the oxide film remover. Thus, to achieve only electrical stability during junction, the oxidation inhibitor and the rheology control agent can be added when necessary.

On the other hand, to achieve long-term electrical stability after the junction, the aqueous solution 103 preferably contains the oxidation inhibitor in addition to the oxide film remover. The oxidation inhibitor is attached to the bare surface exposed by extension of the oxide film remover to the periphery of the junction portion, and reduce oxidation of the bare surface during partial pressure contact between the metal plates 101 and 102.

In addition, the rheology control agent is used to control viscosity of the aqueous solution 103 to reduce extension of the aqueous solution 103. In a case where the oxidation inhibitor is contained in addition to the oxide film remover as in this embodiment, it is necessary to add the rheology control agent to reduce extension of the aqueous solution 103.

The amount of the aqueous solution 103 to be dropped can be greater than or equal to $0.15$ ml/mm$^2$ and less than or equal to $1.5$ ml/mm$^2$.

Figure 2B:
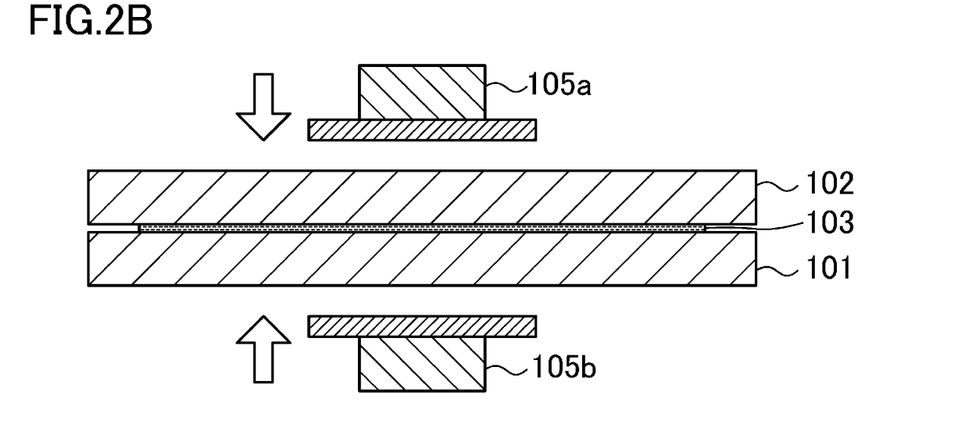

As a second process step, as illustrated in FIG. 2B, the second metal plate 102 is brought into contact with the aqueous solution 103 that has been dropped onto the first metal plate 101 (step S04 in FIG. 1). By bringing the second metal plate 102 into contact with the aqueous solution 103, an oxide film on the second metal plate 102 is removed with the aqueous solution 103, and a bare surface is exposed on the second metal plate 102 (step S05 in FIG. 1). Thereafter, using metal punches 105a and 105b at least one of which has been previously heated, a predetermined load is applied to regions on the first metal plate 101 and the second metal plate 102 in the vertical direction (i.e., in the direction perpendicular to the principal surface) (step S06 in FIG. 1). The predetermined load is preferably greater than or equal to 10 g/cm$^2$ and less than or equal to 500 g/cm$^2$. Preferable values of the load vary depending on the shapes, dimensions, use, etc. of the metal plates 101 and 102, and are not limited to the above-described range.

In a case where the metal plates 101 and 102 are members constituting a semiconductor device such as a power semiconductor device, for example, the period of application of a load is preferably 80 seconds or less in consideration of productivity.

Heating of the metal punches 105a and 105b to a heating temperature is previously performed by, for example, an internal heater before application of the load. In a case where the metal plates 101 and 102 are members constituting a semiconductor device, the heating temperature of the metal punches 105a and 105b can be set in the range from 80° C. to 200° C., both inclusive, in consideration of the influence of heat to semiconductor elements, for example. In this manner, heating of the metal punches 105a and 105b to the heating temperature ensures high-speed junction between the metal plates 101 and 102, and evaporates moisture and the oxide film remover in the aqueous solution 103 (step S07 in FIG. 1).

Further, ultrasonic wave may be applied to at least one of the metal punches 105a and 105b or the metal plates 101 and 102 either concurrently with heating or solely. Then, it becomes possible to ensure high-speed junction, while stirring the aqueous solution 103 such that the concentrations of the oxide film remover and the oxidation inhibitor are uniform in the aqueous solution 103.

Figure 2C:
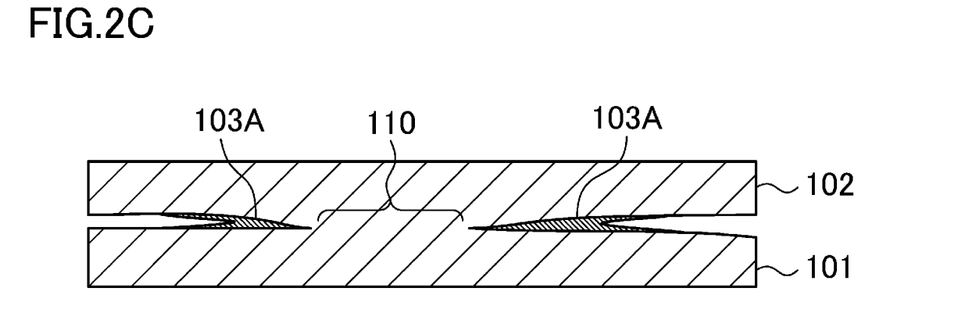
Figure 3:
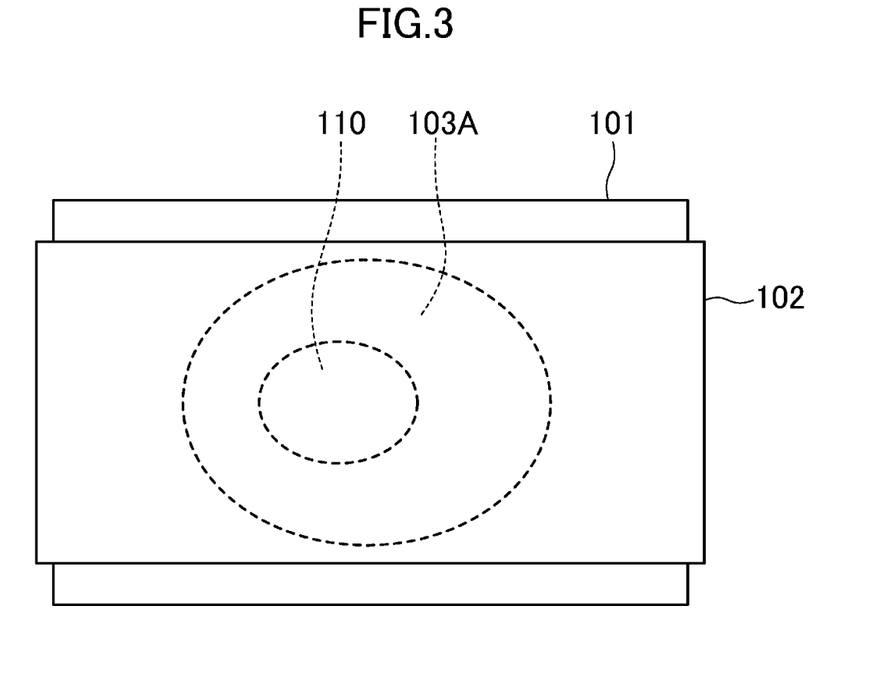
FIG. 3 is a plan view corresponding to FIG. 2C.

Then, as a third process step, as illustrated in FIGS. 2C and 3, the junction portion 110 is formed on regions of the first metal plate 101 and the second metal plate 102 to which the load was applied, and thereby, the first metal plate 101 and the second metal plate 102 are joined together. In this manner, a joined body constituted by the first metal plate 101 and the second metal plate 102 is manufactured (step S08 in FIG. 1). In the case of performing the junction with a general metal press, as illustrated in FIGS. 2C and 3, the metal plates 101 and 102 come to have fillet shapes. As illustrated in FIGS. 2C and 3, in the joined body, the fillet shapes of the metal plates 101 and 102 around the junction portion 110 fill the clearance between the metal plates 101 and 102 and join the metal plates 101 and 102 together.

In this embodiment, the aqueous solution 103 containing the above-mentioned components is used and the metal punches 105a and 105b are heated, thereby forming an anti-corrosion film (a rust-inhibiting organic film in a case where the metal plates are made of iron (Fe)) 103A containing an oxidation inhibitor as a main component around the junction portion 110 (step S09 in FIG. 1). The anti-corrosion film 103A is a film formed after evaporation of moisture and the oxide film remover in the aqueous solution 103. This anti-corrosion film 103A is formed on side surfaces of the fillet shapes of the metal plates 101 and 102 formed around the junction portion 110. In this manner, formation of the anti-corrosion film 103A can reduce deterioration of the junction portion 110 due to oxidation and corrosion of an exposed bare surface.

In this embodiment, the distance between the first metal plate 101 and the second metal plate 102 in the junction is greater than or equal to 0.5 μm and less than or equal to 100 μm.

The reason why the distance of the first metal plate 101 and the second metal plate 102 is greater than or equal to 0.5 μm is to allow the aqueous solution 103 in an amount necessary for removing the oxide film to be present between the metal plates 101 and 102.

The reason why the distance is less than or equal to 100 μm is to cause the aqueous solution 103 (the anti-corrosion film 103A after the junction) to flow and stay on the surfaces of the fillet shapes formed on the upper metal plate in the vertical direction (the second metal plate 102 in FIG. 2C) by utilizing capillary action.

Figure 4A:
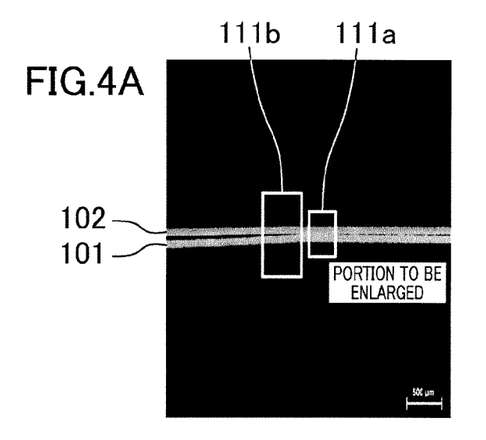
FIGS. 4A-4C are scanning electron micrographs showing cross sections of a joined body in the inter-metal junction technique of the embodiment.
Figure 4B:
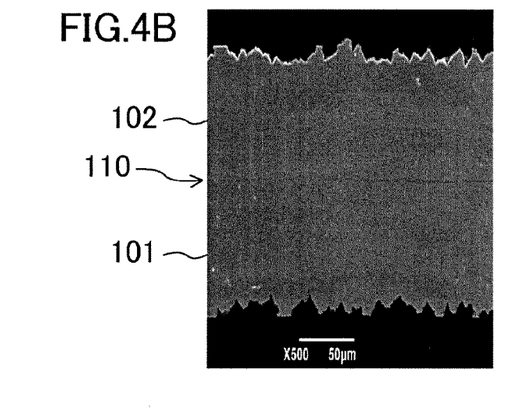
Figure 4C:
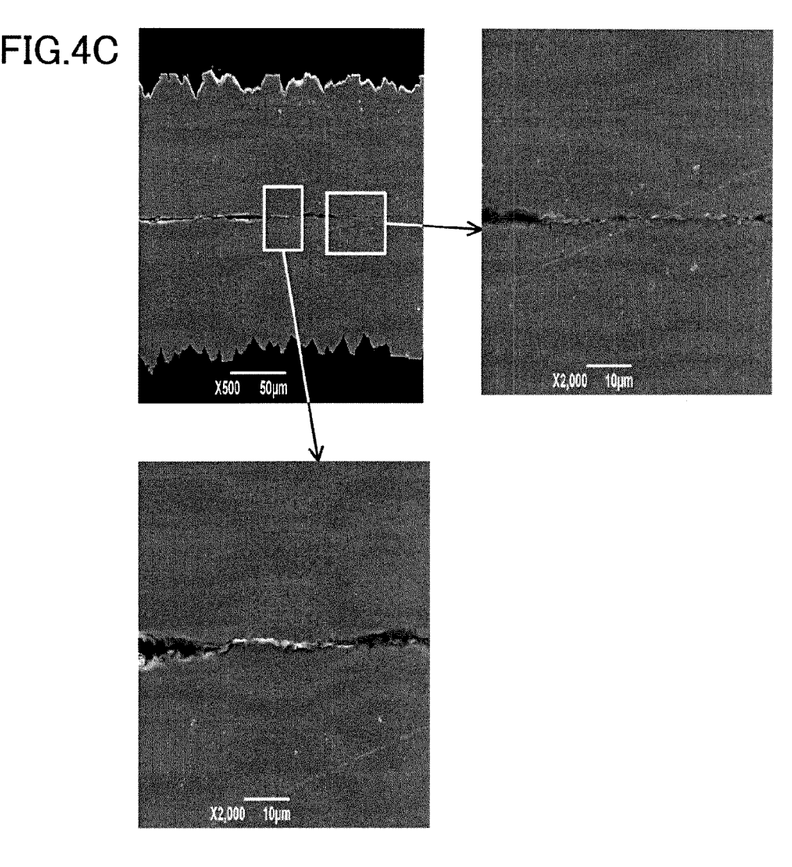

FIGS. 4A-4C are scanning electron micrographs showing cross sections of a joined body in a case where the first metal plate 101 and the second metal plate 102 are made of copper (Cu). In these micrographs, the amount of the aqueous solution 103 to be dropped is 0.72 ml/mm$^2$.

FIG. 4B shows a partial cross section of a region 111a (a center part of the junction portion 110) of FIG. 4A enlarged at a magnification of 500. FIG. 4C shows partial cross sections of a region 111b (an outer peripheral part of the junction portion 110) of FIG. 4A enlarged at magnifications of 500 and 2000, respectively. FIG. 4C includes cross sections of regions except the junction portion 110, i.e., regions that are not joined.

The partial enlarged cross section of FIG. 4B shows that the junction portion 110 of the metal plates 101 and 102 is formed as intended.

The partial enlarged cross section of FIG. 4C shows that the peripheral parts of the junction portion 110 of the metal plates 101 and 102 are partially joined together and a clearance is present between the metal plates 101 and 102.

The first metal plate 101 and the second metal plate 102 may be made of materials except copper (Cu), which is used in this embodiment, by appropriately adjusting the composition of the aqueous solution 103 and conditions for the junction. In a case where the first and second metal plates 101 and 102 are members constituting a semiconductor device, a metal of at least one of copper (Cu), aluminium (Al), nickel (Ni), or iron (Fe), or an alloy containing one of these element as a main component is often used.

For the metal plates 101 and 102, the metals or the alloy may be of the same type or of different types. In a case where the metal plates 101 and 102 are made of metals of different types, an aqueous solution 103 suitable for each of the types of the metals needs to be used. That is, in a case where oxide films with different properties are formed on the surfaces of metals of different types, an aqueous solution 103 suitable for both types of metals needs to be used.

In this embodiment, plate-shape metals (metal plates) are used as members to be subjected to metal junction. However, these metals do not need to have plate-shapes, and may have any shapes that can be joined in general.

In the above manner, in this embodiment, the use of the heated die punches and the aqueous solution containing, for example, the oxide film remover enables easy and electrically stable metal junction to manufacture a joined body.

Bus bars as rod-shape metal members used as power supply lines instead of wires are mechanically or electrically joined together with screws in conventional techniques. Application of this embodiment to such bus bars, for example, can eliminate the necessity of screws to simplify junction processes, and also reduce the weight of electrical equipment using the bus bars.

The present disclosure is also applicable to a so-called grain boundary junction performed by providing a particle boundary in a junction surface.

(First Variation of Embodiment)

In a first variation, in a case where the aqueous solution 103 contains no oxidation inhibitor, an oxide film may be formed under specific conditions after joining the first metal plate 101 and the second metal plate 102 together. In this manner, by forming an oxide film instead of the anti-corrosion film 103A formed on the bare surface, oxidation and corrosion can be reduced. Specifically the first metal plate 101 and the second metal plate 102 that have been joined together are exposed to an oxidizing atmosphere (e.g., heated oxygen ($O_2$) atmosphere) and an oxide film is formed on a bare surface formed by an oxide film remover that has flown out from the junction portion 110, thereby reducing oxidation and corrosion without using the anti-corrosion film 103A described above.

In this manner, the oxide film can stabilize the peripheral region of the junction portion 110, thereby ensuring long-term reliability of a joined body, in a manner similar to the case of using the anti-corrosion film 103A. That is, in the first variation, long-term reliability of a joined body can be obtained without using an oxidation inhibitor.

In the first variation, however, since the oxide film is formed in an additional process step, it is necessary to eliminate the influence of removal of the oxide film by an oxide film remover contained in the aqueous solution 103. To eliminate the influence of removal of the oxide film by the oxide film remover, heat treatment may be performed, for example.

The oxidation process may be performed at a heating temperature of 100° C. for a heating period of about one hour, for example.

(Second Variation of Embodiment)

A second variation of the embodiment will be described with reference to FIGS. 5A-5C.

Figure 5A:
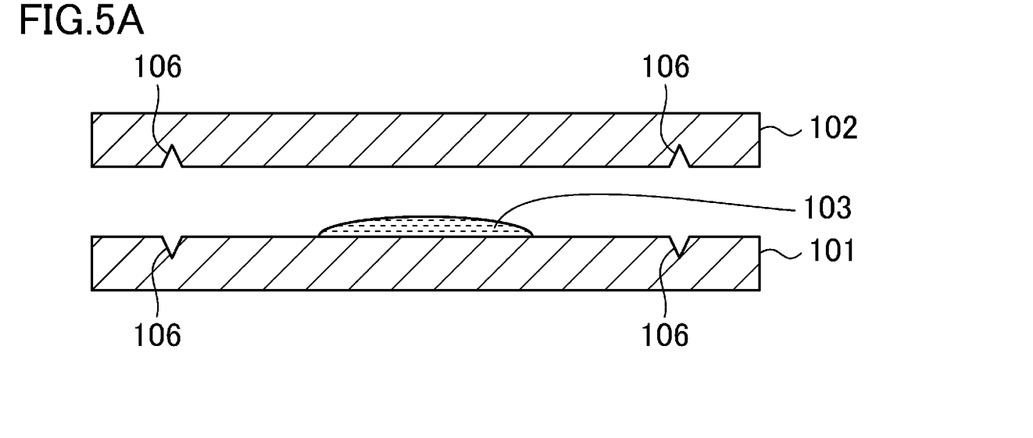
FIGS. 5A-5C are cross-sectional views showing an inter-metal junction technique according to a second variation of the embodiment in the order of process steps.

As illustrated in FIG. 5A, in the second variation, a groove (recess) 106, as an example of a solution outflow prevention means, is formed on a surface of each of the first metal plate 101 and the second metal plate 102 forming the junction portion 110 to surround the junction portion. The groove 106 has a diameter greater than or equal to 1.2, and less than or equal to 2, times as large as the pressing diameter of each of the metal punches 105a and 105b having circular pressing surfaces. Alternatively, the groove 106 surrounding the junction region may have an area about 1.25 times as large as the area of the junction region. That is, the area of the groove 106 is the area where a sufficient amount of the aqueous solution 103 to be dropped to remove an oxide film on the junction region extends. The shape (in plan view) of the groove 106 is not specifically limited as long as the groove 106 has a continuous ring shape. For example, in a case where the pressing surface of each of the metal punches 105a and 105b is circular, the groove 106 is formed to be circular.

The depth of the groove 106 is a half or less of the thickness of each of the metal plates 101 and 102. The reason why the depth of the groove 106 is a half or less of the thickness of each of the metal plates 101 and 102 is that, if the depth of the groove 106 exceeds a half of the thickness of each of the metal plates 101 and 102, the strengths of the metal plates 101 and 102 cannot be maintained.

The groove 106 can be formed by etching using an acid solution, for example. Then, the aqueous solution 103 is dropped on the junction region on the first metal plate 101 (step S01 in FIG. 1).

Figure 5B:
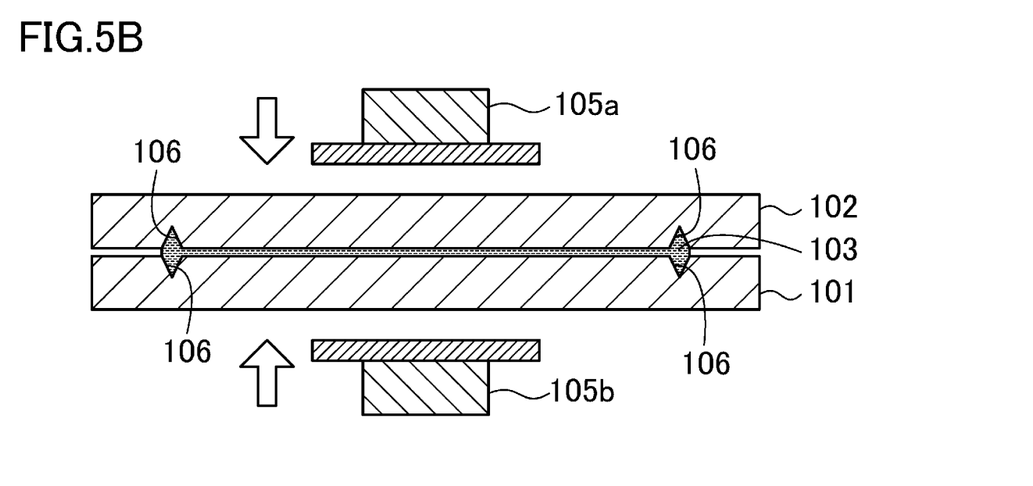

Thereafter, as illustrated in FIG. 5B, the second metal plate 102 is placed on the first metal plate 101 on which the aqueous solution 103 has been dropped, and is brought into contact with the first metal plate 101 (step S04 in FIG. 1). At this time, the aqueous solution 103 flows into the groove 106, and thus, the aqueous solution 103 does not easily expand on the contact interface between the first metal plate 101 and the second metal plate 102. Thus, in a case where the metal plates 101 and 102 are used as members constituting a semiconductor device, it is possible to prevent the aqueous solution 103 from permeating functional elements or other elements constituting the semiconductor device to adversely affect the functional elements or other elements.

Figure 5C:
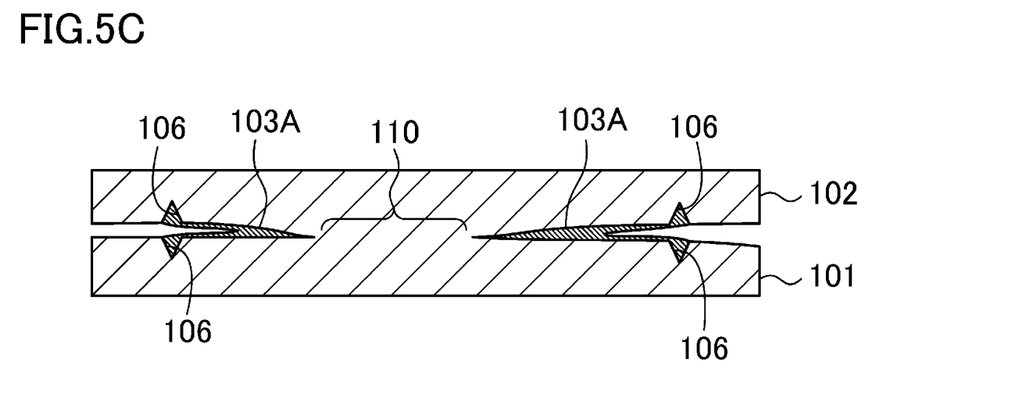

Subsequently, using the metal punches 105a and 105b, a predetermined load is applied to regions of the first metal plate 101 and the second metal plate 102 in the vertical direction (i.e., in the direction perpendicular to the principal surface), thereby forming a junction portion 110 in the first metal plate 101 and the second metal plate 102, as illustrated in FIG. 5C.

In the second variation, as an example of the solution outflow prevention means, the groove (recess) 106 for preventing extension of the aqueous solution 103 to the periphery of the junction region of each of the metal plates 101 and 102. Alternatively, the groove 106 may be formed on at least one of the metal plates 101 and 102. The groove 106 formed only on the lower first metal plate 101 in the vertical direction can substantially prevent extension of the aqueous solution 103.

Instead of the groove 106, as an example of the solution outflow prevention means, a protrusion (projection) surrounding the junction region and projecting from the junction surface may be provided on at least one of the first metal plate 101 or the second metal plate 102. In this case, the protrusion blocks a flow of the aqueous solution 103, thereby preventing unnecessary extension of the aqueous solution 103.

The protrusion can be formed by pressing, for example.

EXAMPLES

As an example of a joined body and a manufacturing method of the joined body according to the present disclosure, a power module (power semiconductor device) to be incorporated in an inverter controller will be described with reference to FIGS. 6, 7A, and 7B.

Figure 6:
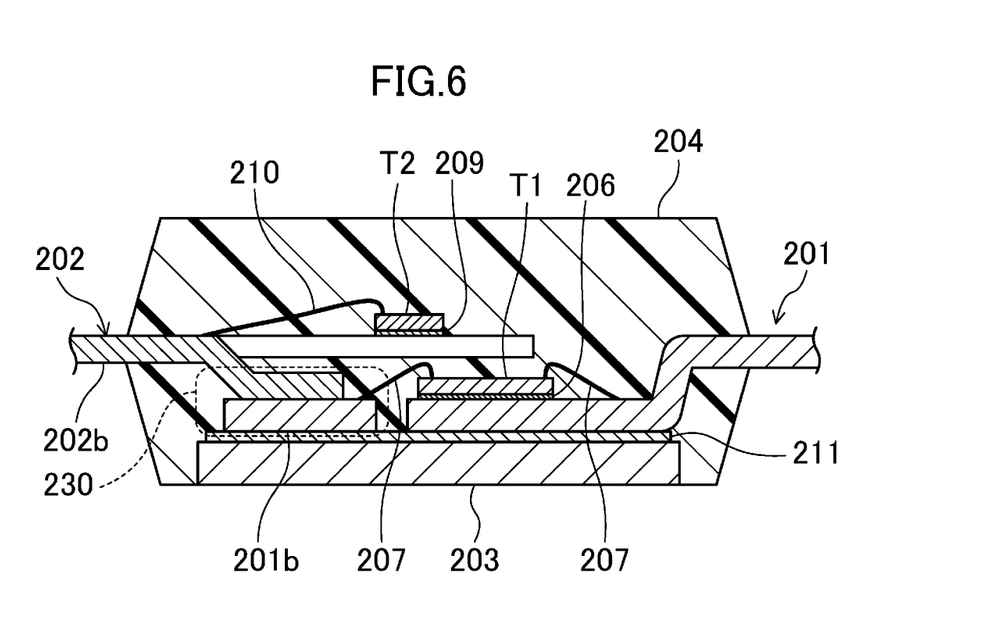
FIG. 6 is a cross-sectional view illustrating a power module using the inter-metal junction technique of the embodiment.
Figure 7A:
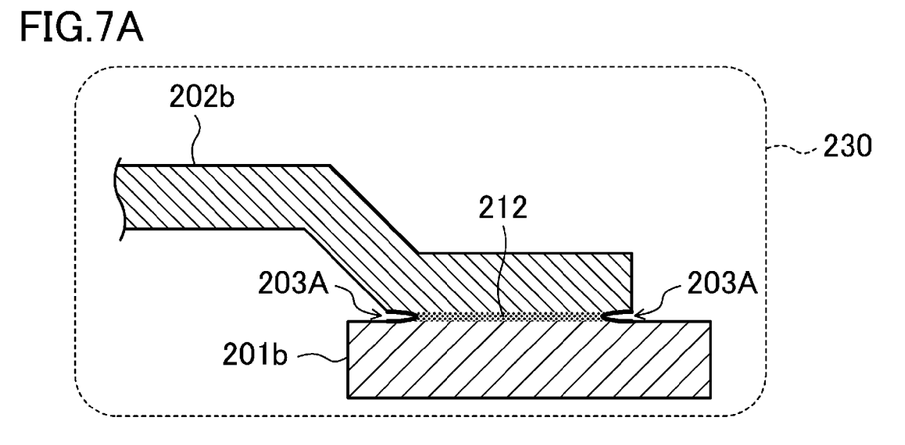
FIG. 7A is an enlarged cross-sectional view illustrating a region including a junction portion illustrated in FIG. 6.
Figure 7B:
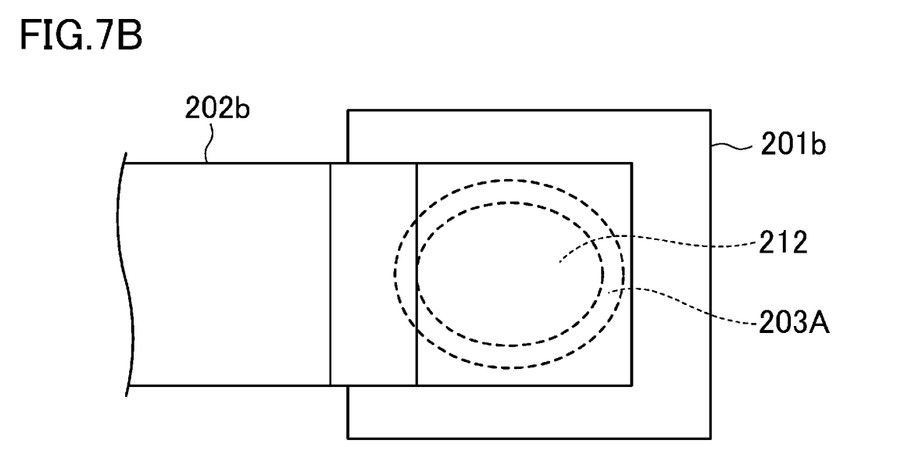
FIG. 7B is an enlarged plan view illustrating the region including the junction portion.

As illustrated in FIGS. 6, 7A, and 7B, a power module according to this example includes a first lead frame 201 holding a power device T1 on a first die pad, a second lead frame 202 holding a control device T2 on a second die pad, a heat dissipating plate 203 fixed to the lower surface of the first lead frame 201 with an insulating sheet 211 interposed therebetween, and a housing 204 of an encapsulating resin.

The housing 204 covers one end of the first lead frame 201 including the power device T1 and an end of the second lead frame 202 including the control device T2, exposes the lower surface of the heat dissipating plate 203.

At least part of the first die pad overlaps with the second die pad in plan view in order to reduce the size of the power module. At least part of the power device T1 also overlaps with the control device T2 in plan view.

In the power module of this example, one of leads of the first lead frame 201 is a relay lead 201b for a power device (hereinafter referred to as a power device relay lead 201b). One of leads of the second lead frame 202 is a relay lead 202b for a control device (hereinafter referred to as control device relay lead 202b).

As illustrated in FIGS. 7A and 7B showing a region 230 including a junction portion in an enlarged manner, ends of the power device relay lead 201b and the control device relay lead 202b are joined together by a junction portion (an alloy layer) 212 according to the present disclosure to form a joined body, thereby manufacturing a power module.

A power module according to the present disclosure will be specifically described hereinafter.

The first lead frame 201 is made of, for example, a metal having a high conductivity such as copper (Cu).

The power device T1 may be, for example, an insulated gate bipolar transistor (IGBT) or a metal oxide semiconductor field-effect transistor (a power MOSFET).

The power device T1 is fixed to the upper surface of a first die pad of the first lead frame 201 with a brazing material 206. Bonding pads (not shown) of the power device T1 are electrically connected to leads of the first lead frame 201 by wires 207 of, for example, aluminium (Al).

The heat dissipating plate 203 can be made of, for example, copper (Cu) or aluminium (Al). The insulating sheet 211 sandwiched between the heat dissipating plate 203 and the die pads is made of an insulating material having thermal conductivity.

The second lead frame 202 is made of, for example, copper (Cu) or an ally 42 (Fe-42% Ni).

The control device T2 is a semiconductor chip for controlling the power device T1, and includes, for example, a drive circuit and an overcurrent protection circuit. The control device T2 is fixed to the upper surface of the second die pad of the second lead frame 202 by, for example, a silver (Ag) paste 209. Bonding pads (not shown) of the control device T2 are electrically connected to leads of the second lead frame 202 by wires 210 of gold (Au).

As described above, in this example, the power device relay lead 201b is provided in the first lead frame 201, the control device relay lead 202b is provided in the second lead frame 202, and the power device relay lead 201b and the control device relay lead 202b are joined together by the junction portion 212 using an inter-metal junction technique according to the present disclosure.

In this manner, in this example, the power device relay lead 201b and the control device relay lead 202b are joined together by metal junction using an aqueous solution containing an oxide film remover, an oxidation inhibitor, and a rheology control agent, for example, thereby electrically connecting the leads 201b and 202b together. In this process, a rust-inhibiting organic film 203A is formed around the junction portion 212.

Consequently, using neither a solder material nor a brazing material to join the relay leads 201b and 202b together, a long-term stable metal junction can be achieved by junction using mechanical pressure contact.

In the case of using copper (Cu) for the first lead frame 201 and the second lead frame 202, an alloy to which iron (Fe), zirconium (Zr), nickel (Ni), tin (Sn), phosphorus (P), or silicon (Si), for example, is added may be used.

Industrial Applicability

A joined body, a power semiconductor device, and manufacturing methods of the joined body and the power semiconductor device according to the present disclosure enable electrically stable junction by utilizing mechanical pressure contact between metals, for example, and are useful for a wide range of fields such as lead frames for semiconductor devices and bus bars for batteries.

DESCRIPTION OF REFERENCE CHARACTERS 101 first metal plate
102 second metal plate
103 aqueous solution
103A anti-corrosion film
105a, 105b metal punch
106 groove
110 junction portion
111a, 111b region
201 first lead frame
201b power device relay lead
202 second lead frame
202b control device relay lead
203A rust-inhibiting organic film
204 housing
206 brazing material
207 wire
209 silver paste
210 wire
211 insulating sheet
212 junction portion
230 region including a junction portion
T1 power device
T2 control device

The invention claimed is:

1. A joined body, wherein
an anti-corrosion film for oxidation inhibition is formed on a side surface, and around, a junction portion in which a first junction target member and a second junction target member each made of a metal are directly joined.

2. The joined body of claim 1, wherein the anti-corrosion film is directly formed on a bare surface around the junction portion on at least one of the first junction target member or the second junction target member.

3. The joined body of claim 1, wherein
each of the first junction target member and the second junction target member has a fillet shape around the junction portion, and
the anti-corrosion film is formed along a surface of the fillet shape of each of the first junction target member and the second junction target member.

4. A joined body, wherein
an anti-corrosion film for oxidation inhibition is formed around a junction portion in which a first junction target member and a second junction target member each made of a metal are directly joined,
each of the first junction target member and the second junction target member has a fillet shape around the junction portion,
the anti-corrosion film is formed along a surface of the fillet shape of each of the first junction target member and the second junction target member, and
the anti-corrosion film is made of diethylethanolamine.

5. The joined body of claim 1, wherein a clearance is present between the first junction target member and the second junction target member.

6. The joined body of claim 1, wherein
each of the first junction target member and the second junction target member is a lead frame or a bus bar, and
the lead frame or the bus bar is made of copper, an alloy containing copper as a main component, iron, or an alloy containing iron as a main component.

7. A power semiconductor device comprising the joined body of claim 1.

8. The power semiconductor device of claim 7, wherein a recess or a projection surrounding the junction portion is formed at least on the first junction target member.

* * * * *